(12) United States Patent
Bertrand et al.

(10) Patent No.: US 12,293,257 B2
(45) Date of Patent: May 6, 2025

(54) DEVICE WITH TWO SUPERPOSED ELECTROSTATIC CONTROL GATE LEVELS

(71) Applicant: COMMISSARIAT A L'ENERGIE ATOMIQUE ET AUX ENERGIES ALTERNATIVES, Paris (FR)

(72) Inventors: Benoit Bertrand, Grenoble (FR); Biel Martinez I Diaz, Grenoble (FR); Yann-Michel Niquet, Grenoble (FR); Maud Vinet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 576 days.

(21) Appl. No.: 17/654,181

(22) Filed: Mar. 9, 2022

(65) Prior Publication Data
US 2022/0292384 A1 Sep. 15, 2022

(30) Foreign Application Priority Data
Mar. 15, 2021 (FR) ...................................... 2102536

(51) Int. Cl.
*G06N 10/40* (2022.01)
(52) U.S. Cl.
CPC ................... *G06N 10/40* (2022.01)
(58) Field of Classification Search
CPC .... G06F 1/20; G06F 11/0724; G06F 11/0751; G06F 11/0793; G06F 15/16; G06F 18/25;
(Continued)

(56) References Cited

U.S. PATENT DOCUMENTS

| 10,522,669 B2* | 12/2019 | Barraud ................ H01L 29/167 |
| 2004/0232473 A1 | 11/2004 | Hsu et al. |
| 2008/0116503 A1 | 5/2008 | Tsurumi et al. |
| 2019/0043950 A1* | 2/2019 | George ................ H01L 29/127 |
| 2019/0392352 A1* | 12/2019 | Lampert ................ G06F 1/206 |
| 2020/0052101 A1 | 2/2020 | Petta et al. |

FOREIGN PATENT DOCUMENTS

| FR | 3 081 155 A1 | 11/2019 |
| WO | WO 2018/236404 A1 | 12/2018 |
| WO | WO 2019/066843 A1 | 4/2019 |

OTHER PUBLICATIONS

U.S. Appl. No. 16/159,923, filed Oct. 15, 2018, US 2019/0123183 A1, Hutin, et al.

(Continued)

*Primary Examiner* — Binh C Tat
(74) *Attorney, Agent, or Firm* — Oblon, McClelland, Maier & Neustadt, L.L.P.

(57) ABSTRACT

A quantum device, includes a semiconductor portion comprising several first quantum dot regions each disposed between at least two second tunnel barrier regions and placed next to the two second regions; first gates each comprising a first conductive portion; and second gates each comprising at least a second conductive portion and a second dielectric disposed between the second conductive portion and the first conductive portion of one of the first gates, such that each of the first gates is disposed between the semi-conductor portion and one of the second gates. The first and second gates are disposed above the first regions or above the second regions, the second gates being solely located in a vertical extension of the first gates.

17 Claims, 11 Drawing Sheets

(58) Field of Classification Search
CPC ...... G06F 1/10; G06F 15/7817; G06F 9/4498; G06N 10/00; G06N 10/70; G06N 10/20; G06N 20/00; G06N 3/08; G06N 10/40; G06N 10/80; G06N 10/60; H10F 77/1433
USPC .................................................. 716/100–106
See application file for complete search history.

(56) References Cited

OTHER PUBLICATIONS

U.S. Appl. No. 16/626,827, filed Jun. 27, 2018, US 2020/0226486 A1, Bourdet, et al.
U.S. Appl. No. 17/577,551, filed Jan. 18, 2022, Bedecarrats, et al.
French Preliminary Search Report Issued Nov. 30, 2021 in French Application 21 02536 filed on Mar. 15, 2021 (with English Translation of Categories of Cited Documents), 3 pages.
Hwang et al., "Impact of G-Factors and Valleys on Spin Qubits in a Silicon Double Quantum Dot", Cornell University Library, NY, Aug. 28, 2016, 8 Pages.
Yang et al., "Dynamically Controlled Charge Sensing of a Few-Electron Silicon Quantum Dot", AIP Advances, 1, 042111, https://doi.org/10.1063/1.3654496, 2011, 7 Pages.
Pillarisetty et al., "Qubit Device Integration Using Advanced Semiconductor Manufacturing Process Technology", IEDM, 2018, 4 Pages.
Taylor, "The Role of Surface-Gate Technology for AlGaAs/GaAs Nanostructures", Nanotechnology 5, 1994, 17 Pages.
Schäffler, "High-Mobility Si and Ge Structures", Semiconductor Science and Technology, 12, 1997, 36 Pages.

* cited by examiner a)

b)

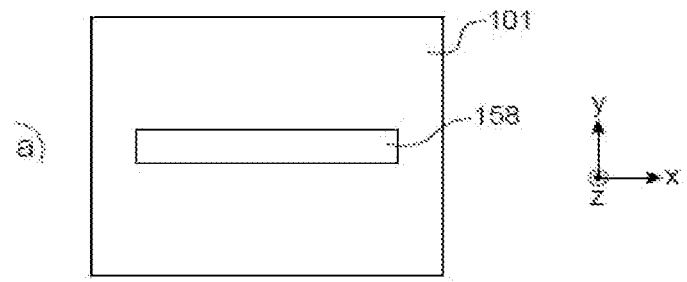
FIG.15
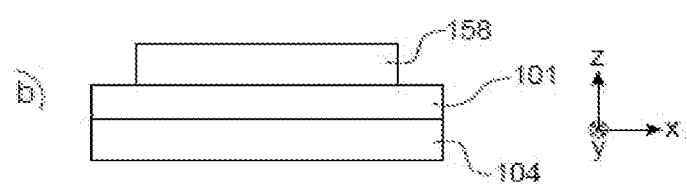
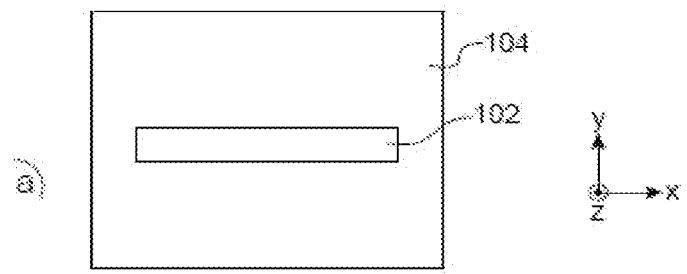
FIG.16
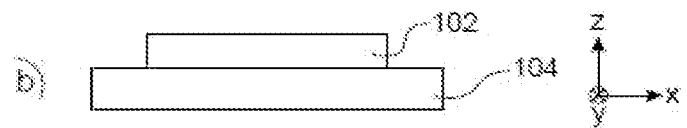

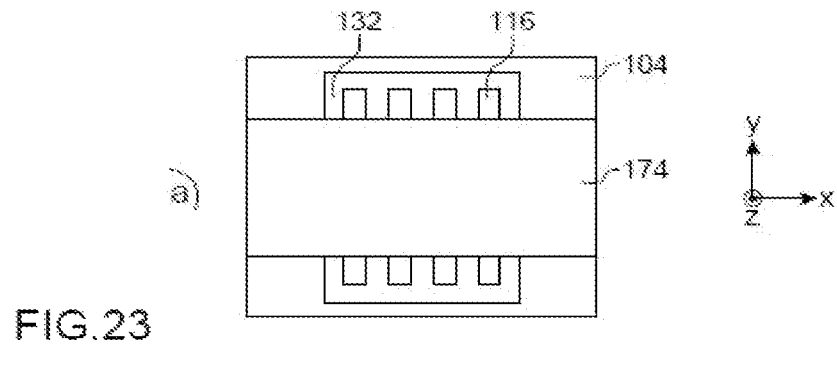
FIG.23
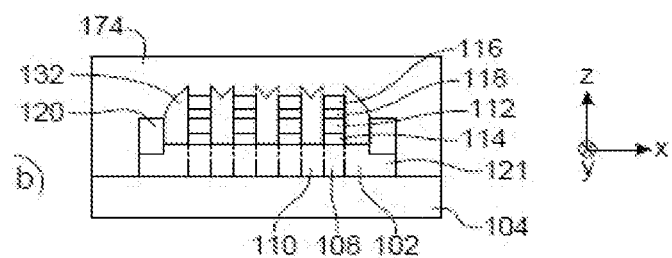
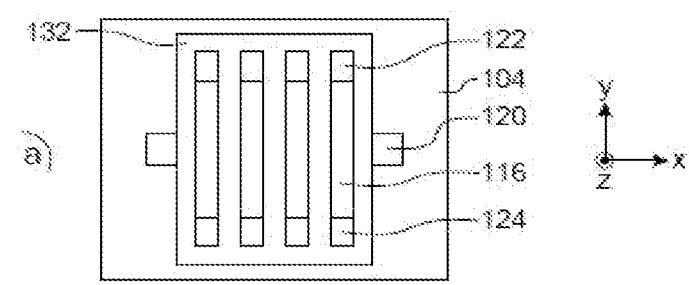
FIG.24
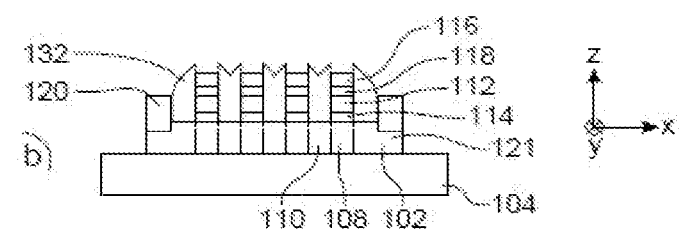

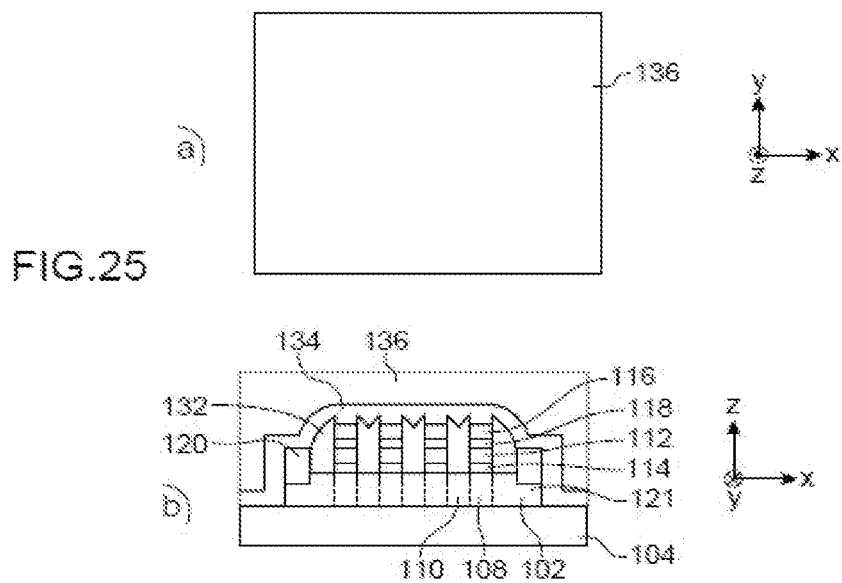
FIG.25
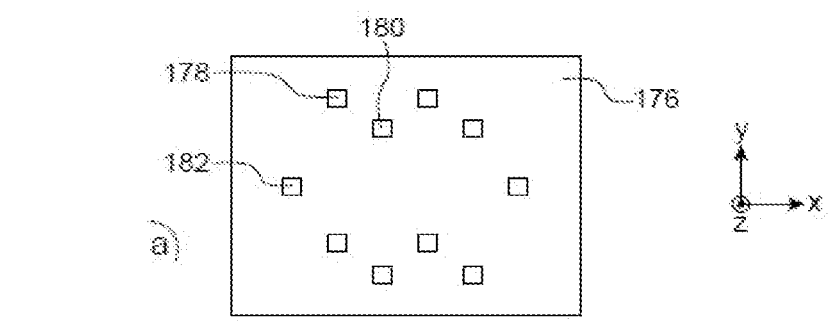
FIG.26
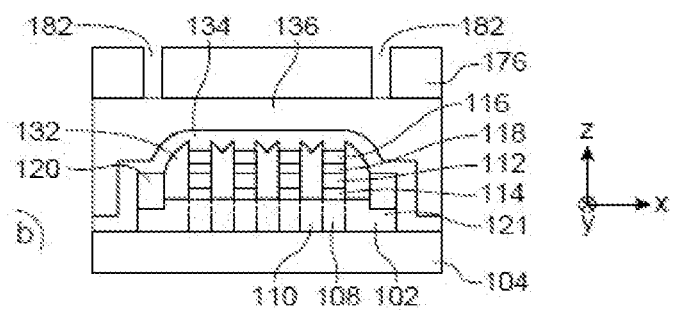

DEVICE WITH TWO SUPERPOSED ELECTROSTATIC CONTROL GATE LEVELS

TECHNICAL FIELD AND PRIOR ART

The invention relates to the field of devices with electrostatic control gates. The invention particularly applies to the field of quantum devices, quantum information processing, and quantum computing.

Quantum computing is based on the use of a quantum state with two measurable levels as an information vector, referred to as qubit or quantum bit, and the laws of quantum mechanics (superposition, entanglement, measurement) in order to execute algorithms. A quantum device with one or more spin qubits can be used to manipulate the quantum state of this or these qubits.

Spin qubits can be formed in semiconductor, advantageously, silicon. Semiconductor technologies are studied for producing qubits due to the high integration potential thereof, like conventional electronics. Electrons or holes are individually confined in quantum wells located in a cryostat at cryogenic temperatures (less than 4 K, or less than 1 K) produced in confinement structures of nanometric sizes defined electrostatically and, in the case of silicon, of similar architecture to that of MOSFETs. These confinement structures correspond to quantum dots. A quantum dot behaves as a potential well confining one or more elementary charges (electrons or holes) in a semiconductor region.

Applying a static magnetic field (e.g., between 100 mT and 1 T) makes it possible to remove the spin degeneracy of quasi-particles which is a quantum system with two measurable levels, known as "spin down" and "spin up". The quantum state thereof is a superposition of these two states represented by the direction of an arrow in a sphere, known as the Bloch sphere. The manipulation (rotation) of these spins is performed using an alternating component of the magnetic field (of frequency for example between 1 GHz and several dozen GHz) or using an alternating electric field at the same frequencies in the case of sufficient spin-orbit interaction (case of holes in silicon) or in the presence of static magnetic field gradient (e.g., micro-magnet integration). Reading the spins (up or down) makes it possible to extract a portion of the quantum information according to the probability of it being in each state, determined by the quantum superposition.

To optimally control several quantum dots formed side by side in the same semiconductor portion, it is necessary to be able to adjust, in addition to the depth of each of the quantum dots in the semiconductor, i.e., the minimum potential of each of the quantum dots, the height of the tunnel barriers, or tunnel-effect barriers, which separate the quantum dots, independently.

The control of the height of the tunnel barriers and the minimum potential of each quantum dot is performed by means of voltages applied to independent electrostatic control gates. The solutions proposed to date consist of defining control gates positioned directly above each quantum dot and each tunnel barrier.

The document by C. H. Yang et al., "Dynamically controlled charge sensing of a few-electron silicon quantum dot", AIP Advances, 1, 042111, 2011, describes for example the production of such gates by implementing two or three successive lithography cycles, with partial overlap of the different levels to manage misalignment problems. The document by R. Pillarisetti et al., IEDM 18, proposes the self-aligned production of such gates.

These solutions, however, have the drawback of requiring the production of electrostatic control gates with a density two times more than with which the quantum dots are produced. The gate pitch to be achieved with these solutions is between 40 nm and 60 nm, which renders gate production complex.

Similar problems to those described above for quantum devices also arise for other types of electrostatic control gate devices.

DESCRIPTION OF THE INVENTION

Therefore, there is a need to provide a device with electrostatic control gates wherein the structure enables easier production of the electrostatic control gates.

For this, a device is proposed including at least:
- a semiconductor portion comprising several first regions each disposed between at least two second regions and placed next to the two second regions;
- first electrostatic control gates each comprising at least a first portion of electrically conductive material;
- second electrostatic control gates each comprising at least a second portion of electrically conductive material and at least a second gate dielectric disposed between the second portion of electrically conductive material and the first portion of electrically conductive material of one of the first electrostatic control gates, such that each of the first electrostatic control gates is disposed between the semi-conductor portion and one of the second electrostatic control gates;
- wherein, in a first configuration, the first and second electrostatic control gates are disposed above the first regions of the semiconductor portion, or wherein, in a second configuration, the first and second electrostatic control gates are disposed above the second regions of the semiconductor portion.

In this device, it is proposed to produce gate structures with two stages, or with two different superposed gates, the potential whereof applied to each of the two gates can be adjusted independently in relation to one another.

This superposition of the first and second gates therefore makes it possible to produce gate stacks with a pitch that is two times greater than in the solutions according to the prior art, thus reducing for the most part the problems associated with producing electrostatic control gates.

The second electrostatic control gates may be solely located in the vertical extension of the first electrostatic control gates.

The second electrostatic control gates may be entirely or completely located above a plane including the top faces of the first electrostatic control gates.

In a parallel plane with the top faces of the first electrostatic control gates, the cross-section of each second gate dielectric may have a similar shape and dimensions to those of the cross-section of at least one of the first and second portions of electrically conductive material disposed against said second gate dielectric.

The second gate dielectric may not be in contact with the semiconductor portion.

The second gate dielectric may rest solely on the first portions of electrically conductive material, or solely on the first portions of electrically conductive material and a part of lateral spacers disposed against the first portions of electrically conductive material.

In the first configuration, at least a part of each of the second regions of the semiconductor portion may not be covered by the first and second electrostatic control gates, and in the second configuration, at least a part of each of the first regions of the semiconductor portion may not be covered by the first and second electrostatic control gates.

The device may be such that:
each of the first electrostatic control gates further includes at least a first gate dielectric disposed between the semiconductor portion and the first portion of electrically conductive material of said first electrostatic control gate, or
the device includes a stack of several different semiconductors forming a heterostructure and including the semiconductor portion, and such that interfaces between the stack of several semiconductors and the first portions of electrically conductive material of the first electrostatic control gates form Schottky barriers, or
the device may be such that each of the first electrostatic control gates further includes at least a first gate dielectric disposed between a stack of several semiconductors and the first portion of electrically conductive material, the stack of several semiconductors including different semiconductors forming a heterostructure, such that interfaces between the stack of several semiconductors and the at least a first gate dielectric of the first electrostatic control gates form Schottky barriers.

The semiconductor of the first and second regions may be unintentionally doped.

Advantageously:
the device may correspond to a quantum device;
the first regions of the semiconductor portion may be configured to form quantum dots of at least one spin qubit of the device;
the second regions of the semiconductor portion are configured to form tunnel barriers between which the quantum dots are disposed.

In the first configuration, because the two-stage gate structures are located above the quantum dots, the electric potentials applied to the first electrostatic control gates will make it possible to control essentially the minimum potentials of the quantum dots formed in the first regions of the semiconductor portion located below the first gates. Furthermore, the electric potentials applied to the second electrostatic control gates will make it possible to control essentially the heights of the tunnel barriers formed in the second regions of the semiconductor portion, because the first gates form screens against the electric fields created by the second gates.

In the second configuration, because the two-stage gate structures are located above the quantum dots, the electric potentials applied to the first electrostatic control gates will make it possible to control essentially the heights of the tunnel barriers formed in the second regions of the semiconductor portion located below the first gates, and the electric potentials applied to the second electrostatic control gates will make it possible to control essentially the minimum potentials of the quantum wells formed in the first regions of the semiconductor portion.

The quantum device may be used with hole spins and/or electron spins.

In this quantum device, the gate dielectrics do not correspond to tunnel oxides, i.e., do not allow the passage of the charges by the tunnel effect therethrough.

The device may further include electrical charge carrier reservoirs between which the first and second regions of the semiconductor portion are disposed. These electrical charge carrier reservoirs may correspond to doped parts of the semiconductor portion, and the first and second regions may include unintentionally doped (uid) semiconductor.

The device may be such that:
the first portions of electrically conductive material each have a thickness between 5 nm and 30 nm;
the second gate dielectrics each have a thickness between 2 nm and 15 nm;
the second portions of electrically conductive material each have a thickness between 5 nm and 40 nm.

When the first electrostatic control gates each include a gate dielectric, the first gate dielectrics may each have a thickness between 2 nm and 10 nm.

The device may further include means for applying at least a first electric potential to each of the first portions of electrically conductive material and at least a second electric potential, of a separate value from that of the first electric potential, to each of the second portions of electrically conductive material. These application means may particularly include electrical contacts which are connected to the first and second portions of electrically conductive material, as well as the elements for transporting the desired electric potentials to these electrical contacts.

The device may be such that the first and second regions of the semiconductor portion are aligned along a first direction, or parallel with the first direction, and:
a dimension, parallel with the first direction, of at least one of the first portions of electrically conductive material is less than a dimension, parallel with the first direction, of the second portion of electrically conductive material disposed on said at least one of the first portions of electrically conductive material, or
a dimension, parallel with the first direction, of at least one of the second portions of electrically conductive material is less than a dimension, parallel with the first direction, of the first portion of electrically conductive material disposed under said at least one of the second portions of electrically conductive material.

These alternative embodiments of the electrostatic control gates make it possible to adjust the effects of one of the gates in relation to the other by producing one of the first and second gates with a different width from that of the other gate. In the first case, by reducing the width of the first gate, the part of the semiconductor portion controlled by the second gate therefore has greater dimensions. In the second case, by increasing the width of the first gate in relation to that of the second gate, the part of the semiconductor portion controlled by the first gate has greater dimensions.

The device may be such that:
each of the first and second portions of electrically conductive material includes a greater dimension extending along a second direction perpendicular to the first direction, and
at least one end of each of the first portions of electrically conductive material is not covered by the second portion of electrically conductive material disposed on said first portion of electrically conductive material, and
each of the first portions of electrically conductive material is electrically coupled with a first electrically conductive contact produced on said end of each of the first portions of electrically conductive material, and
each of the second portions of electrically conductive material is electrically coupled with a second electrically conductive contact produced on the second portion of electrically conductive material.

This advantageous configuration enables easy contacting of the first gates which are disposed below the second gates.

In this case, the device may be such that:
first and second ends of each of the first portions of electrically conductive material are not covered by the second portion of electrically conductive material disposed on said first portion of electrically conductive material, and
each of the first portions of electrically conductive material is electrically coupled with a first electrically conductive contact produced on one of the first and second ends of each of the first portions of electrically conductive material, and two of the first electrically conductive contacts electrically coupled with two of the first portions of electrically conductive material disposed side by side are such that one of said two first electrically conductive contacts is produced on the first end of one of said two of the first portions of electrically conductive material and the other of said two first electrically conductive contacts is produced on the second end of the other said two of the first portions of electrically conductive material.

This advantageous configuration makes it possible to distribute the first electrically conductive contacts of the first gates on the first and second ends of the first portions of electrically conductive material, in alternation, which makes it possible to reduce the stress associated with the dimensions of the first electrically conductive contacts which can be greater than when the first electrically conductive contacts are produced next to one another on ends of the first portions all located on the same side.

The semiconductor portion may correspond to a semiconductor nanowire. A semiconductor nanowire corresponds to a semiconductor portion in which the diameter or thickness is nanometric and in which the geometry enables one-dimensional confinement of charges thanks to the electrostatic control of the gates of the device.

In a second embodiment, the device may be such that:
the semiconductor portion includes a top face, a bottom face and lateral faces substantially perpendicular to the top and bottom faces;
each of the first and second control gates partially covers at least one of the first and second top edges of the semiconductor portion formed at the junctions between the top face and the first and second lateral faces opposite one another and parallel with the greatest dimension of the semiconductor portion.

In this configuration, the first semiconductor regions may be formed below the top edges of the semiconductor portion.

Moreover, in this case, the device may be such that:
several of the first and second control gates partially cover the first top edge and the other first and second control gates partially cover the second top edge, each of the first and second control gates partially covering the first top edge being disposed facing a first and a second control gate partially covering the second top edge;
and further including a third electrostatic control gate comprising at least a third portion of electrically conductive material disposed facing at least a fourth region of the semiconductor portion not covered by the first and second electrostatic control gates.

In the case of a quantum device, the fourth region of the semiconductor portion may form second tunnel barriers each separating two of the quantum dots formed at the two top edges.

In this configuration, an arrangement of several quantum dots disposed pairwise facing one another along the nanowire may be obtained. Thus, a two-fold greater number of quantum dots can be formed in the semiconductor nanowire.

In a third embodiment, the first regions of the semiconductor portion may be arranged in the form of a two-dimensional array, several of the first and second electrostatic control gates being arranged in the form of rows and the other first and second control gates being arranged in the form of columns.

In this third embodiment, the semiconductor portion may correspond to a semiconductor layer of nanometric thickness or to a grating of nanowires intersecting by forming an array.

The semiconductor portion may be disposed on a buried dielectric layer of a semiconductor-on-insulator type substrate.

The device may further include dielectric spacers covering lateral sides of the first and second electrostatic control gates, and disposed, in the first configuration, above the second regions of the semiconductor portion, or, in the second configuration, above the first regions of the semiconductor portion.

The dielectric spacers may include at least a first dielectric material covering the lateral sides of the first portions of electrically conductive material and at least a second dielectric material covering the lateral sides of the second portions of electrically conductive material, the permittivity of the first dielectric material being less than that of the second dielectric material.

BRIEF DESCRIPTION OF THE DRAWINGS

The present invention will be understood more clearly on reading the description of embodiment examples given merely by way of indication and not limitation with reference to the appended drawings wherein:

FIGS. 14 to 26 schematically show the steps of a method for producing a device according to the first embodiment;

Identical, similar, or equivalent parts of the various figures described hereinafter bear the same reference numbers so as to facilitate the transition from one figure to another.

Figure 1:
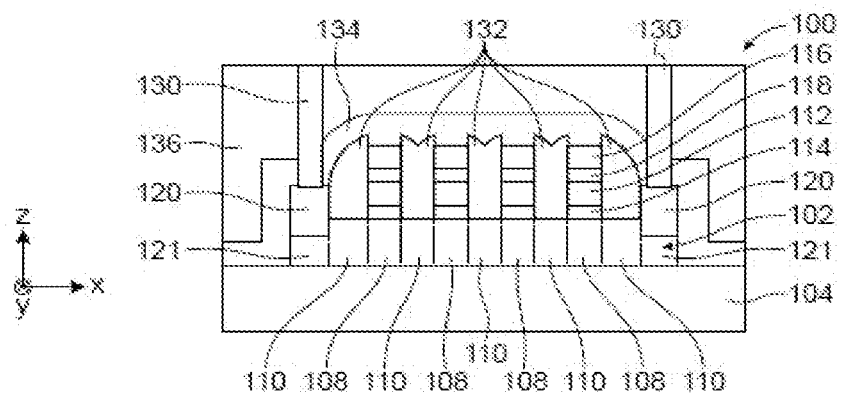
FIGS. 1 to 3 schematically show different views of a device according to a first embodiment.

The various parts in the figures are not necessarily shown on a uniform scale, to render the figures more readable.

The various possibilities (alternatives and embodiments) should be understood as not being mutually exclusive and may be combined with one another.

DETAILED DESCRIPTION OF SPECIFIC EMBODIMENTS

A device 100 with superposed electrostatic control gates according to a first embodiment is described hereinafter with reference to FIGS. 1 to 3. In the embodiment example described hereinafter, the device 100 corresponds to a spin qubit quantum device.

The device 100 includes a semiconductor portion 102. The semiconductor of the portion 102 corresponds for example to silicon, or alternatively to GaAs.

The portion 102 is for example disposed on a dielectric layer 104 which may include $SiO_2$.

Advantageously, the portion 102 corresponds to a part of a superficial layer of a silicon-on-insulator type substrate, e.g., SOI (Silicon-On-Insulator). The dielectric layer 104 corresponds in this case to the buried dielectric, or BOX (Buried-Oxide), layer of this substrate.

In the embodiment example described here, the portion 102 corresponds to a nanowire comprising the following features:
- thickness (dimension along the axis Z) between about 5 nm and 20 nm;
- width (dimension along the axis Y) between about 20 nm and 80 nm;
- length (dimension along the axis X) dependent on the number of quantum dots formed in the portion 102, and between about 60 nm to 120 nm per quantum dot. In the example in FIGS. 1 to 3 where four quantum dots are formed in the portion 102, the length of the portion 102 is between about 350 nm and 650 nm.

The device 100 includes several qubits produced side by side in the portion 102. Each of these qubits comprises a quantum dot formed in a first region 108 of the portion 102 and disposed between two tunnel barriers formed by second regions 110 of the portion 102. In FIG. 1, the first regions 108 are delimited symbolically from the second regions 110 by dotted lines. The first and second regions 108, 110 of the portion 102 include unintentionally doped (uid) semiconductor.

The device 100 includes first electrostatic control gates each comprising at least a first portion of electrically conductive material 112 and at least a first gate dielectric 114 disposed between the portion 102 and the first portion of electrically conductive material 112. In the embodiment example described here, the first gate dielectrics 114 each have a thickness between 2 nm and 10 nm, for example equal to 5 nm, and include $SiO_2$ and/or $HfO_2$ and/or $Al_2O_3$. The first portions 112 each have a thickness between 5 nm and 30 nm, for example equal to 10 nm, and include degenerate doped polysilicon and/or TiN and/or W.

The device 100 also includes second electrostatic control gates disposed on the first gates. These second gates each include at least a second portion 116 of electrically conductive material and at least a second gate dielectric 118 disposed between the second portion 116 and the first portion 112 whereon the second gate is disposed. Thus, each of the first gates is disposed between the semiconductor portion 102 and one of the second gates. In the example described here, the second gate dielectrics 118 each have a thickness between 2 nm and 15 nm, for example equal to 10 nm, and include $SiO_2$ and/or $HfO_2$ and/or $Al_2O_3$, and the second portions 116 each have a thickness between 5 nm and 40 nm, for example equal to 20 nm, and include degenerate doped polysilicon and/or TiN and/or W.

In the embodiment example described here, the first and second gates are disposed above the first regions 108 of the portion 102.

As seen in FIG. 1, the second gates are solely located in the vertical extension of the first gates (the term "vertical" denoting the direction perpendicular to the principal plane of the portion 102 or perpendicular to the plan of the face of the portion 102 whereon the first gates are disposed).

The second electrostatic control gates are entirely or completely located above a plane including the top faces of the first control gates.

In a parallel plane with the top faces of the first control gates, the cross-section of each second gate dielectric 118 has a similar shape and dimensions to those of the cross-section of at least one of the first and second portions of electrically conductive material 112, 116 disposed against said second gate dielectric 118.

The second gate dielectric 118 is not in contact with the portion 102. In the configuration seen in FIG. 1, the second gate dielectric 118 rests solely on the first portions of electrically conductive material 112.

The device 100 also includes electrical charge carrier reservoirs 120 between which the first and second regions 108, 110 are disposed. In the embodiment example described here, the reservoirs 120 correspond to doped semiconductor portions formed by epitaxy on ends 121 of the portion 102. Alternatively, these reservoirs 120 may correspond to the ends 121 of the portion 102 wherein dopants are directly implanted.

Figure 2:
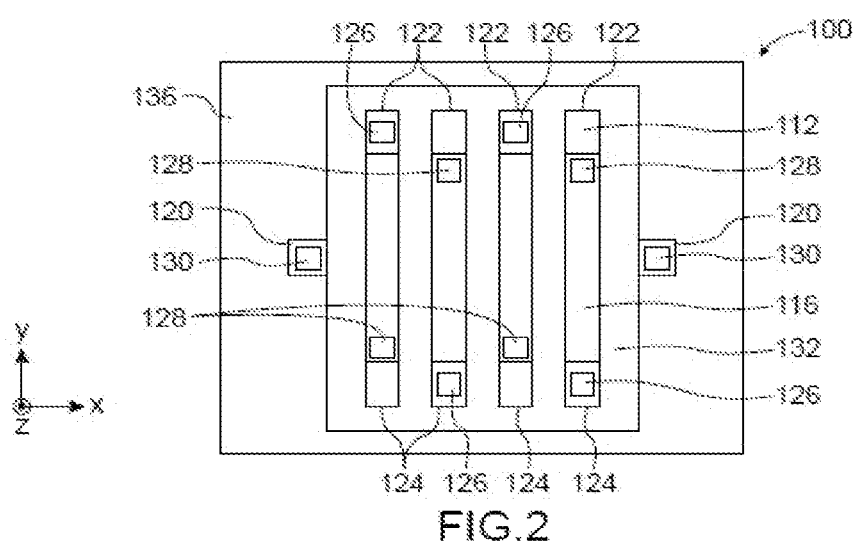

The first and second regions 108, 110 are here aligned along a first direction which is parallel with the length of the nanowire formed by the portion 102 (parallel with the axis X in FIGS. 1 and 2).

Figure 3:
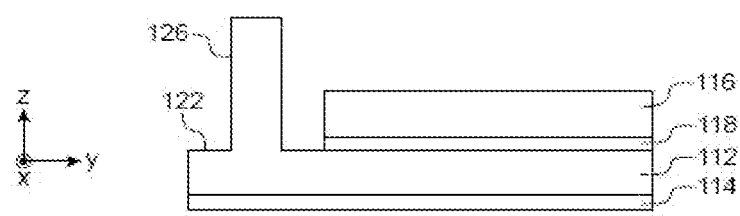

Though not visible in FIGS. 1 to 3, the device 100 also includes means for applying a first electric potential on each of the first portions 112 and a second electric potential, of a separate value from that of the first electric potential, on each of the second portions 116.

In order to be able to access the first gates which are located below the second gates electrically, at least one of the ends of each of the first portions 112 is not covered by the second gate dielectrics 118 and the second portions 116. In the embodiment example shown in FIGS. 1 to 3, the first ends 122 and the second ends 124 of the first portions 112 are not covered by the second gate dielectrics 118 and the second portions 116. Furthermore, each of the first portions 112 is coupled electrically with a first electrically conductive contact 126 produced on one of the ends 122, 124 of each of the first portions 112, and each of the second portions 116 is coupled electrically with a second electrically conductive contact 128 produced on each of the second portions 116. FIG. 3 shows a first end 122 of one of the first portions 112 which is not covered by the second gate disposed on this first portion 112 and which forms a position for one of the first contacts 126.

Advantageously, and as is the case in the configuration shown in FIG. 2, each of the first portions 112 is electrically coupled with a first contact 126 produced on one of the first and second ends 122, 124 of the first portion 112, and two of the first contacts 126 electrically coupled with two of the first portions 112 disposed side by side such that one of said two first contacts 126 is produced on the first end 122 of one of said two of the first portions 112 and that the other of said first contacts 126 is produced on the second end 124 of the other of said two of the first portions 112. Thus, the first contacts 126 are disposed alternately on the first and second ends 122, 124 of the first portions 112, along the portion 102. Given that the pitch, with which the first and second gates are produced along the first direction is particularly dependent on the dimensions of the first contacts 126 in the plane (X, Y) (plan parallel with the interfaces between the portion 102 and the first gate dielectrics 114), this alternating arrangement of the first contacts 126 on the first and second ends 122, 124 makes it possible to reduce this pitch, and therefore the distance separating two neighboring first gates. According to an embodiment example, the pitch with which the first and second control gates are produced is for example equal to 80 nm, each stack of a first and second gates having a dimension, along the first direction, equal to 40 nm and is spaced apart from a neighboring stack of other first and second gates by a distance, along the first direction, equal to 40 nm. Advantageously, the pitch with which the first and second gates are produced is between 60 nm and 120 nm.

The device 100 also includes third electrically conductive contacts 130 produced on the reservoirs 120.

The contacts 126, 128, 130 include for example at least one metal such as for example Ti, TiN or W.

The device 100 also includes dielectric spacers 132 covering lateral sides of the first and second gates. The dielectric spacers 132 include for example $SiO_2$. In the configuration in FIG. 1 where the first and second gates are disposed above the first regions 108, the dielectric spacers 132 are disposed above the second regions 110. If the first and second gates were disposed above the second regions 110, the dielectric spacers 132 would be disposed above the first regions 108.

All the elements of the device 100 described above other than the contacts 126, 128 and 130 are covered by an etch stop layer 134, including for example SiN. The whole is covered by a pre-metal dielectric material 136, including for example $SiO_2$ and wherein the top surface is planarized and through which the contacts 126, 128 and 130 are produced. In FIG. 2, the parts of the etch stop layer 134 and the pre-metal dielectric material 136 located above the gates and the dielectric spacers 132 are not shown so as to have a top view of the gates and the dielectric spacers 132.

Thus, the device 100 includes, at each qubit, a gate structure with two stages, or with two different superposed gates, where the electric potential whereof applied to each of the two gates can be adjusted independently in relation to one another. Because, in the embodiment example described here, the two-stage gate structures are located above the quantum dots, the electric potentials applied to the first electrostatic control gates will make it possible to control the minimum potentials of the quantum dots formed in the first regions 108 located below the first gates, and the electric potentials applied to the second gates will make it possible to control the levels of the tunnel barriers formed in the second regions 110. Because the first gates form screens against the electric fields created by the second gates, these fields will therefore serve to control not the minimum potentials of the quantum dots formed in the first regions 108, but to control the levels of the tunnel barriers in the second regions 110 not covered by the first gates.

For the tunnel barriers which are located between two quantum wells, the level of each of these tunnel barriers is controlled by means of the two second gates located above the two quantum wells adjacent to the tunnel barrier.

The field generated by each of the first gates will, notwithstanding, have an influence on the levels of the tunnel barriers adjacent to the quantum dot controlled by each of the first gates. Furthermore, the electric field generated by each of the second gates also has an influence on the minimum potential of the quantum well present below each of the second gates. Thus, the values of the electric potentials to be applied to each of the first and second gates are chosen accounting for the influence of the other gates present in the vicinity thereof.

Figure 4:
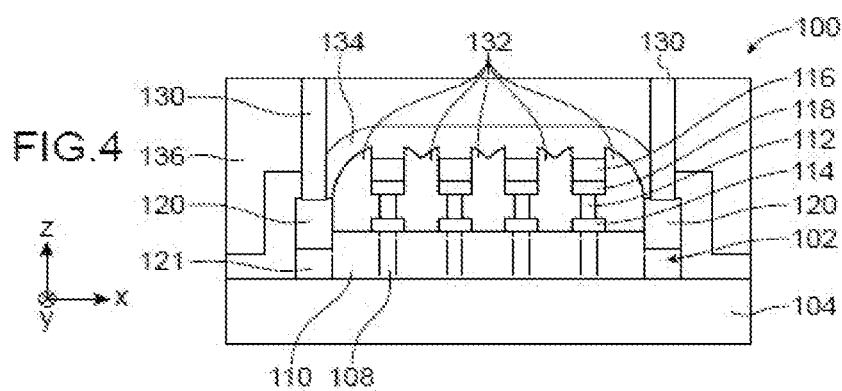
FIGS. 4 to 6 schematically show alternative embodiments of the device according to the first embodiment.

FIG. 4 shows the device 100 according to a first alternative embodiment. In this first alternative embodiment, the dimension of each of the first portions 112 which is parallel with the first direction (alignment direction of the first and second regions 108, 110, parallel with the axis X in FIG. 4) is less than the same dimension of each of the second portions 116. This particularly has the effect of reducing the dimension, along this first direction, of the quantum dots formed below the first portions 112, i.e., first regions 108, and of increasing the dimension, along this first direction, of the tunnel barriers corresponding to the second regions 110. Furthermore, in this first alternative embodiment, the second gate dielectrics 118 rest solely on the first portions of electrically conductive material 112 and a part of the lateral spacers 132 disposed against the first portions of electrically conductive material 112.

Figure 5:
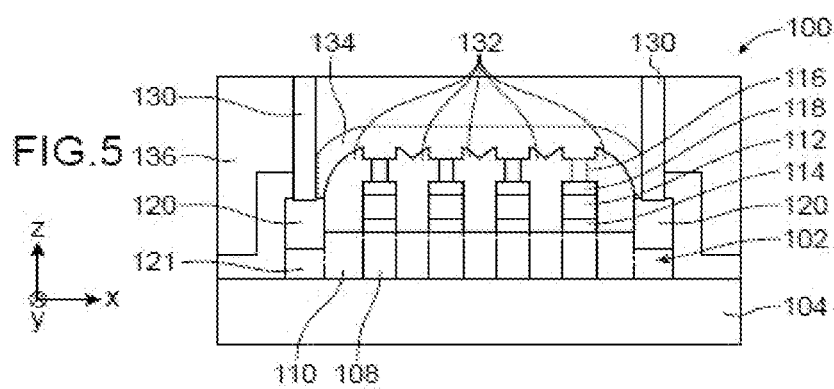

FIG. 5 shows the device 100 according to a second alternative embodiment. In this second alternative embodiment, the dimension of each of the first portions 112 which is parallel with the first direction (alignment direction of the first and second regions 108, 110, parallel with the axis X in FIG. 4) is greater than the same dimension of each of the second portions 116. This particularly has the effect of increasing the dimension, along this first direction, of the quantum dots formed below the first portions 112, i.e., first regions 108, and of reducing the dimension, along this first direction, of the tunnel barriers corresponding to the second regions 110.

These two alternative embodiments make it possible to adjust the effects of the first and second gates in relation to one another, according to the values of the minimum potentials sought for the quantum dots and the levels of the tunnel barriers formed in the portion 102.

Figure 6:
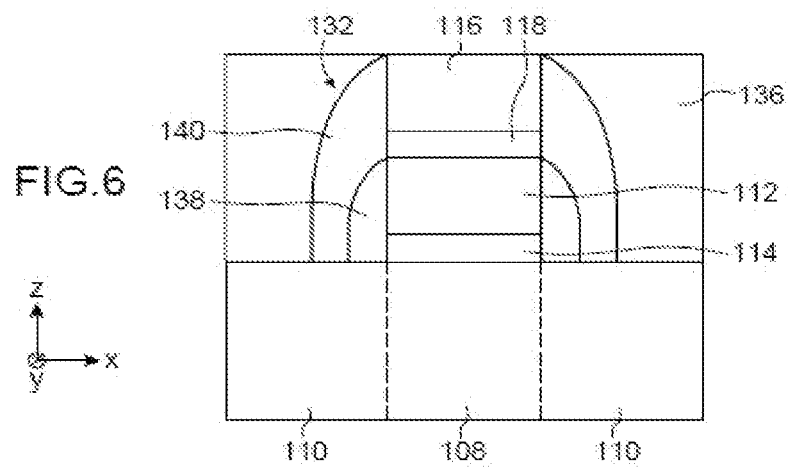

In the devices 100 described above with reference to FIGS. 1 to 5, the dielectric spacers 132 covering the lateral sides of the first and second gates include a single dielectric material. Alternatively, it is possible that these dielectric spacers 132 include at least a first dielectric material covering the lateral sides of the first portions 112 and at least a second dielectric material covering the lateral sides of the second portions 116. FIG. 6 schematically shows such a configuration, wherein the dielectric spacers 132 include a first part 138 comprising a first dielectric material covering the lateral sides of the first portions 112 and a second part 140 comprising a second dielectric material covering the lateral sides of the second portions 116. In the diagram in FIG. 6, the first part 138 of the dielectric spacers 132 also covers the lateral sides of the first gate dielectric 114 and the second part 140 of the dielectric spacers 132 also covers the lateral sides of the second gate dielectric 118. In this alternative embodiment, the permittivity of the first dielectric material of the first part 138 is advantageously less than that of the second dielectric material of the second part 140. The first dielectric material is for example a so-called "Low-k" material, such as for example $SiO_2$, and the second dielectric material is for example a so-called "High-k" material, such as for example SiN.

Figure 7:
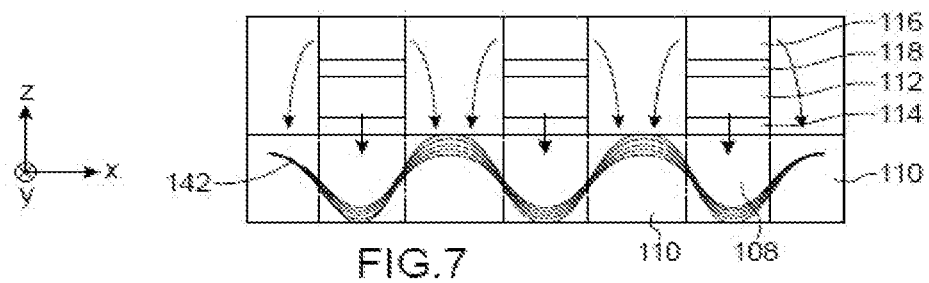
FIGS. 7 to 8 schematically show two configurations of the device according to the first embodiment.

In the devices 100 described above, the first and second gates are disposed above the first regions 108 wherein the quantum dots are formed. FIG. 7 schematically shows this first configuration, whereon the curve referenced 142 symbolically represents the potential obtained in the first and second regions 108, 110 via the electric fields applied by the first and second gates.

Figure 8:
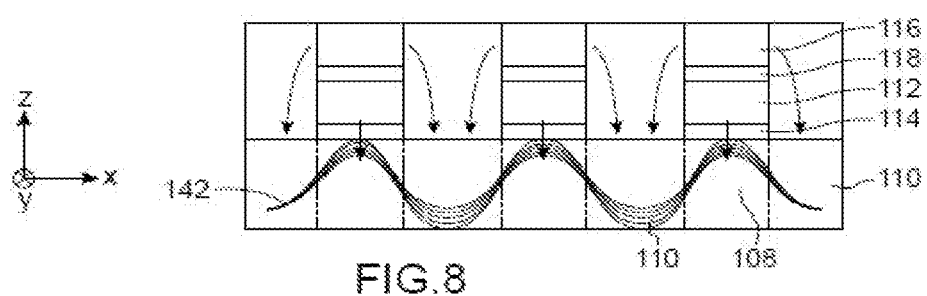

In a second configuration, the first and second gates may be disposed above the second regions 110 which form the tunnel barriers. In this case, the electric potentials applied to the first gates make it possible to control the level of the tunnel barriers formed in the second regions 110, and the electric potentials applied to the second gates make it possible to control the minimum potentials of the quantum wells formed in the first regions 108. The level of each quantum well is controlled by means of the two second gates located above the two tunnel barriers adjacent to the quantum well. FIG. 8 schematically shows this second configuration.

Given that the first and second regions 108, 110 include a similar material, the fact that the device 100 is found in one or the other of these two configurations is dependent on the values of the electric potentials applied to the first and second portions 112, 116.

In the case where electrons are confined in quantum dots, and relative to the work functions of the different materials present, more positive (or negative) voltages on the first (or second) gates will produce the first configuration, whereas more negative (or positive) voltages on the first (or second) gates will produce the second configuration. In the case of quantum dots confining holes and not electrons, the voltage polarizations described above are inverted.

Figure 9:
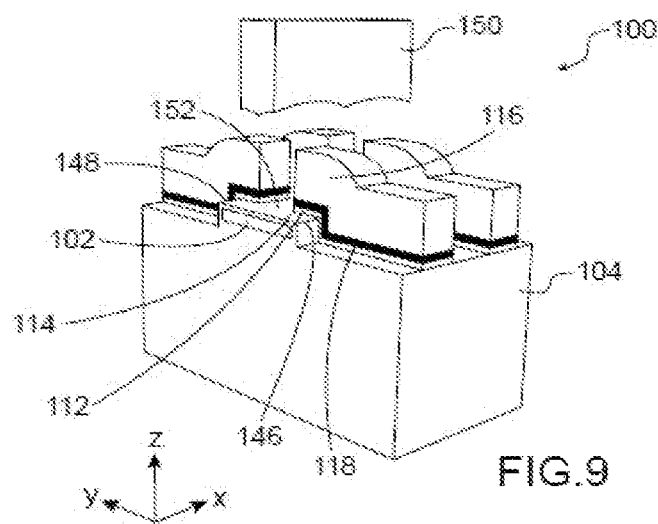
FIG. 9 schematically shows a device according to a second embodiment.

A device 100 according to a second embodiment is described hereinafter with reference to FIG. 9.

In this second embodiment, each of the first and second gates does not cover the portion 102 across the entire width of the portion 102, but solely on a part of this width so as to cover one of the top edges 146, 148 of the portion 102, the other top edge of the portion 102 being covered by other first and second electrostatic control gates. With such control gates, quantum dots are therefore formed below each of the top edges 146, 148 of the portion 102, which makes it possible, in relation to the first embodiment, to double the number of quantum dots that can be obtained in the portion 102. The quantum dots located facing one another below the two top edges 146, 148 are separated by a tunnel barrier in which the potential is controlled by a third electrostatic control gate comprising at least a third electrostatic control gate comprising at least a first portion of electrically conductive material 150 and at least a third gate dielectric disposed between the portion 102 and the third portion 150. This third gate is disposed facing a fourth region 152 of the portion 102 which is not covered by the first and second gates and wherein the tunnel barriers separating each of the two quantum dots formed below the two top edges 146, 148 are formed. In the embodiment example shown in FIG. 9, the first gate dielectric 114 and the third gate dielectric are formed by the same layer of dielectric material covering the portion 102. In the example in FIG. 9, the third portion 150 rests on all or part of the etch stop layer 134 (not shown in FIG. 9 for reasons of clarity of this figure) as well as on any dielectric spacers (also not shown in FIG. 9 for reasons of clarity of this figure).

As in the first embodiment, the values of the electric potentials to be applied to each of the first and second gates and to the third gate will be chosen accounting for the influence of the other gates present in the vicinity thereof.

Detailed features of an embodiment example of the device 100 according to this second embodiment are given below:
- portion 102 formed by a silicon nanowire having a thickness (dimension along the axis Z) equal to 10 nm, a width (dimension along the axis Y) equal to 80 nm and a length (dimension along the axis X) equal to 140 nm;
- dielectric layer 104 of thickness equal to 145 nm;
- first portions 112 including TiN and a thickness equal to 5 nm;
- first gate dielectrics 114 including $SiO_2$ and a thickness equal to 5 nm;
- second portions 116 including polysilicon and a thickness equal to 40 nm;
- second portions 118 including $SiO_2$ and a thickness equal to 5 nm;
- spacing between two first and two second gates disposed side by side on the same top edge of the portion 102 equal to 40 nm;
- spacing between two first and two second gates disposed facing one another and which cover two different top edges equal to 40 nm;
- spacing between the portion 102 and the third gate 150 between 85 nm and 90 nm;
- thickness of the third gate 150 equal to 65 nm;
- width (dimension along the axis Y) of the third gate 150 equal to 40 nm.

The various alternative embodiments and other features described above for the first embodiment may be applied to the device 100 according to the second embodiment.

Figure 10:
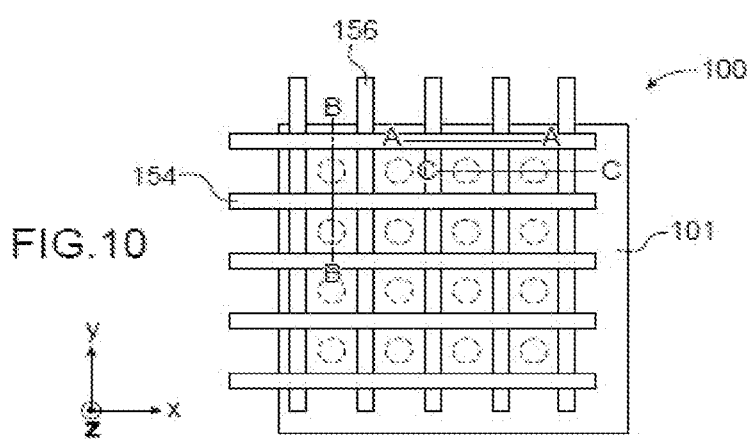
FIGS. 10 to 13 schematically show different views of a device according to a third embodiment.
Figure 11:
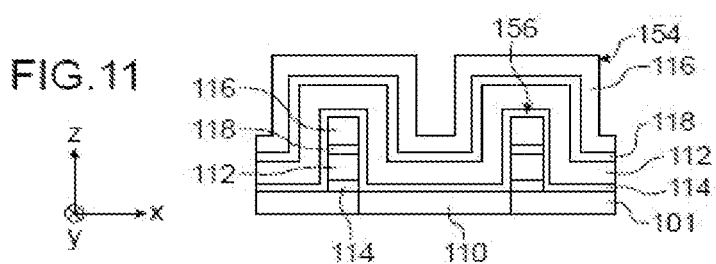
Figure 12:
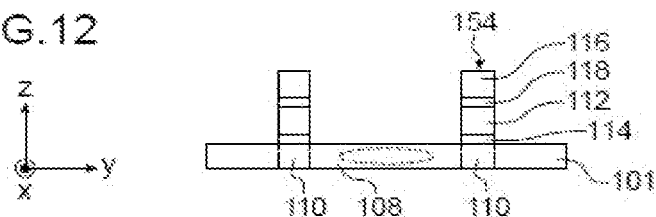
Figure 13:
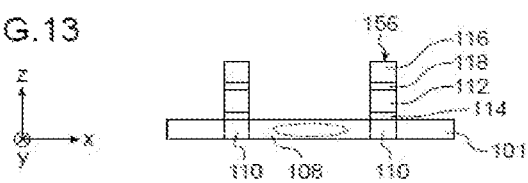

A device 100 according to a third embodiment is described hereinafter with reference to FIGS. 10 to 13. FIG. 10 corresponds to a top view of the device 100. FIGS. 11 to 13 correspond to sectional view respectively along the axes AA, BB and CC (seen in FIG. 10) of a part of the device 100.

In this third embodiment, the qubits are arranged in the form of a two-dimensional array of quantum dots. Unlike the previous embodiments, the quantum dots are not produced in a semiconductor nanowire, but in a semiconductor portion corresponding to a semiconductor layer 101 or to a grating of nanowires intersecting by forming an array.

Several of the first and second electrostatic control gates are arranged in the form of rows and bear the reference 154, and other first and second gates are arranged in the form of columns which bear the reference 156 and which are superposed on the gate rows 154 at the intersections between the gate rows and columns.

In this third embodiment, the quantum dots are formed in the regions of the portion 102 which are not covered by the first and second gates. These quantum wells are symbolically represented, in FIG. 10, by dotted circles. Thus, the first gates (first portions 112+first gate dielectrics 114) of the rows 154 and columns 156 serve mainly to define the potentials of the tunnel barriers and the second gates (second portions 116+second gate dielectrics 118) serve mainly to define the minimum potentials of the quantum dots.

The various alternative embodiments and other features described above for the first embodiment may be applied to the device 100 according to the third embodiment.

In all the embodiments and alternative embodiments described above, the semiconductor portion 102 may be part of a stack of several different semiconductors forming a heterostructure. Such a heterostructure corresponds for example to an alternating stack of layers of Si and SiGe, or of layers of GaAs and AlGaAs, or of Ge and SiGe. In this case, it is possible that the first electrostatic control gates may not include the first gate dielectric(s) 114, and the portions of electrically conductive material 112 may be disposed directly against the stack of semiconductors. The interface(s) between the stack of semiconductors and the portion(s) of electrically conductive material 112 of the first electrostatic control gates form in this case Schottky barriers, and the semiconductor portion 102 comprising the first and second regions 108, 110 corresponds to the layer of the heterostructure wherein the two-dimensional electron gas (2DEG) is formed. Examples of choices of metallic and semiconductor materials for forming Schottky barriers are for example described in the documents "The role of surface-gate technology for AlGaAs/GaAs nanostructures", R P Taylor 1994 Nanotechnology 5 183, and "High-mobility Si and Ge structures", Friedrich Schaffler 1997 Semicond. Sci. Technol. 12 1515.

A method for producing the device 100 according to the first embodiment is described hereinafter with reference to FIGS. 14 to 26. In each of these figures, a view a) corresponding to a top view of the device 100 and a view b) corresponding to a sectional view of the device 100 are shown.

Figure 14:
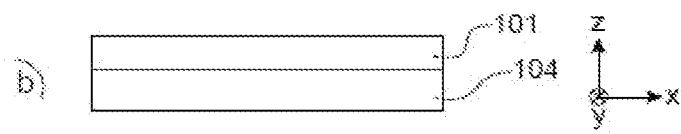

The device 100 is produced from a semiconductor layer 101 which, in the embodiment example described here, corresponds to the superficial layer of a semiconductor-on-insulator type, and more particularly SOI type, substrate (FIG. 14). The layer 101 includes silicon and the dielectric layer 104 includes $SiO_2$. The thickness (dimension along the axis Z) of the layer 101 is for example between 10 nm and 25 nm.

The layer 101 is then etched so that at least one remaining portion 102 forms a nanowire wherein the quantum dots of the device 100 will be produced. For this, a first etching mask 158, including for example a resin, is deposited on the semiconductor layer 101 (FIG. 15), then lithography and etching are implemented so that the remaining portion 102 of semiconductor corresponds to the nanowire wherein the quantum dots of the device 100 will be produced (FIG. 16). The first etching mask 158 is then removed.

Alternatively, it is possible not to implement the steps described above with reference to FIGS. 15 and 16, when the quantum dots of the device 100 are produced directly in the layer 101 as is the case in the third embodiment described above.

Figure 17:
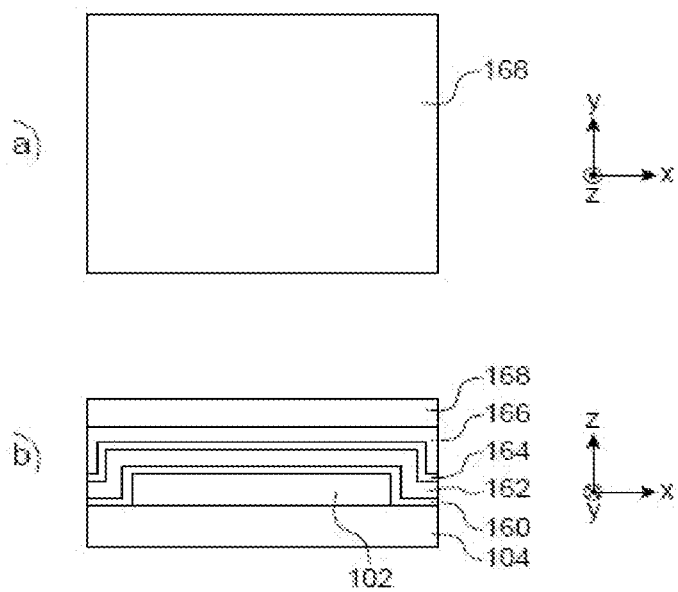

A stack of material layers intended to produce the first and second electrostatic control gates is then deposited by covering the portion 102 and the dielectric material of the layer 104. This stack includes a first dielectric layer 160 intended to produce the first gate dielectrics 114, a first electrically conductive layer 162 intended to produce the first portions of electrically conductive material 112, a second dielectric layer 164 intended to produce the second gate dielectrics 118, and a second electrically conductive layer 166 intended to produce the second portions of electrically conductive material 116. In order to be able to etch this stack of layers 160, 162, 164, 166 and form the first and second electrostatic control gates, a hard mask layer 168, corresponding for example to a layer of SiN of thickness equal to 30 nm, is deposited on this stack (FIG. 17).

Figure 18:
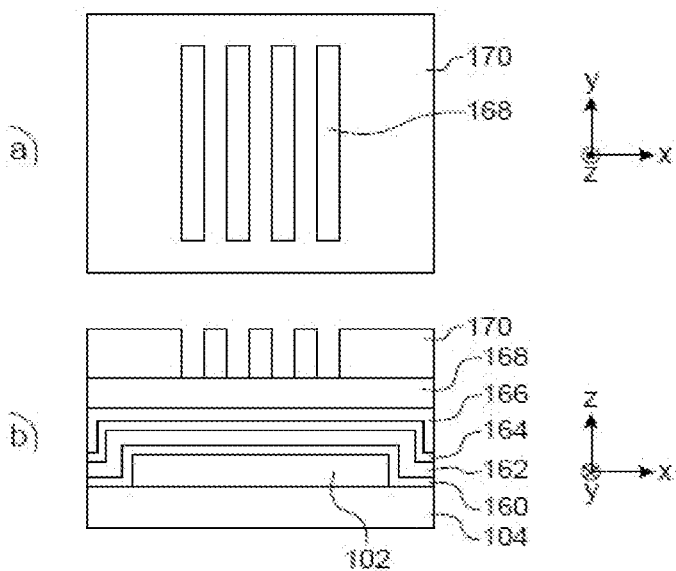
Figure 19:
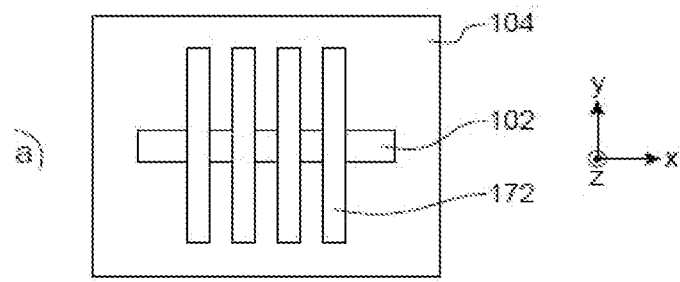
Figure 19:
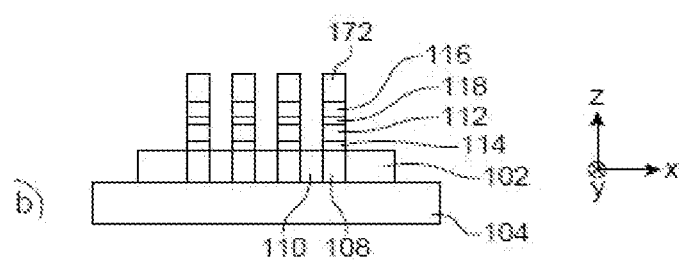
Figure 20:
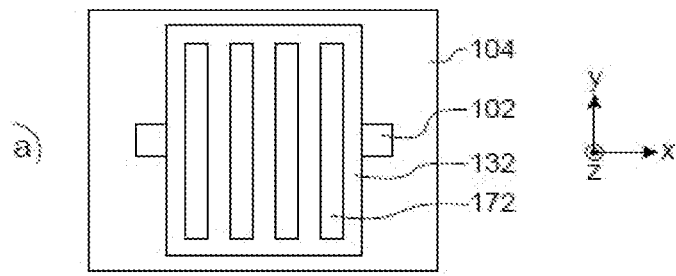
Figure 20:
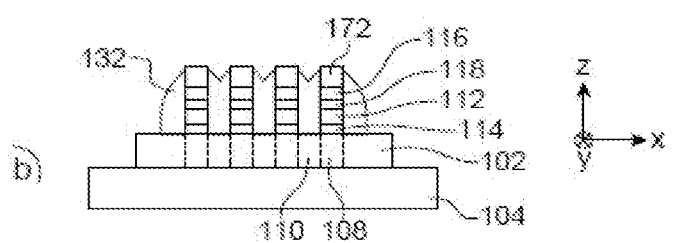

A second etching mask 170 is then deposited on the hard mask layer 168, the pattern whereof corresponds to that of the control gates to be produced (FIG. 18). The hard mask layer 168 and the stack of layers 160, 162, 164, 166 are then subjected to lithography and etching according to the pattern of the second etching mask 170. The remaining portions of these layers correspond to the first and second portions of electrically conductive material 112, 116, to the first and second gate dielectrics 114, 118, and to remaining hard mask portions 172 (FIG. 19). The embodiment of the first and second electrostatic control gates also defines, in the portion 102, the first and second regions 108, 110.

The dielectric spacers 132 are then produced by covering the lateral sides of the first and second gates, these lateral sides corresponding to the faces of the first and second gates which are perpendicular to the surface of the portion 102 whereon the gates are produced. In the example shown in FIG. 20, the dielectric spacers 132 also cover the lateral sides of the remaining hard mask portions 172.

Figure 21:
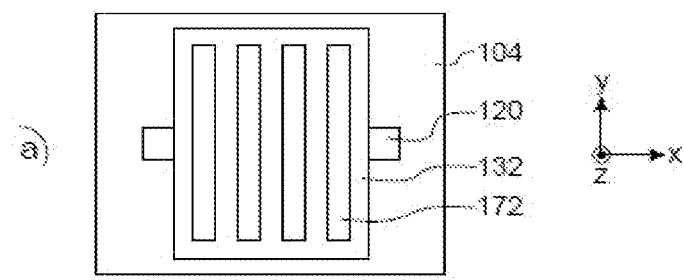
Figure 21:
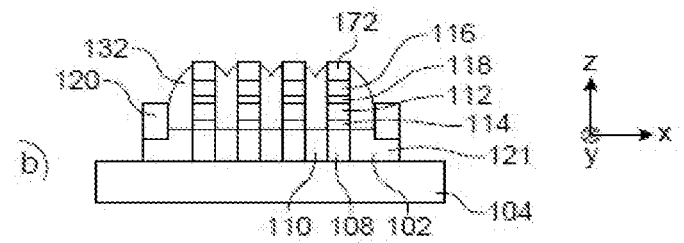

As shown in FIG. 21, the charge carrier reservoirs 120 are produced by epitaxy on the ends 121 of the portion 102, with in-situ doping of the semiconductor portions forming the reservoirs 120. Alternatively, the charge carrier reservoirs may be produced by implanting dopants directly in the ends 121 of the portion 102 not covered by the first and second gates and by the dielectric spacers 132.

Figure 22:
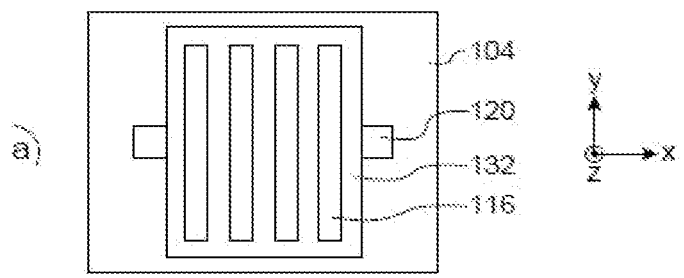
Figure 22:
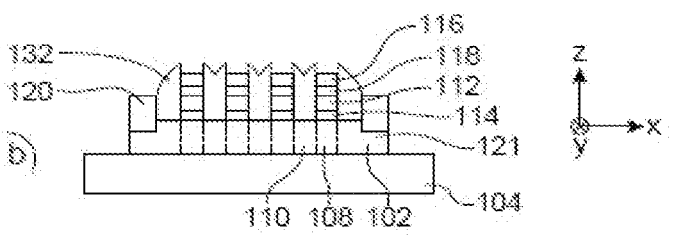

The remaining hard mask portions 172 are then removed (FIG. 22).

A third mask 174 is then produced so as to cover the second portions 116, except for the regions covering the first and second ends 122, 124 of the first portions 122 at which the first electrically conductive contacts 126 are intended to be produced (FIG. 23).

The parts of the second portions 116 and the second gate dielectric 118 not covered by the third mask 174 are then etched, thus revealing the first and second ends 122, 124 of the first portions 112. The third mask 174 is then removed (FIG. 24).

An etch stop layer 134 and a pre-metal dielectric material 136 are then deposited and planarized (see FIG. 25).

A fourth mask 176 is then produced on the structure produced, wherein the openings define the positions of the electrical contacts of the device 100: first openings 178 define the positions of the first contacts 126, second openings 180 define the positions of the second contacts 128, and third openings 182 define the positions of the third contacts 130 (see FIG. 26).

The device 100 is then completed by etching the pre-metal dielectric material 136 and the etch stop layer 134 plumb with the openings 178, 180 and 182 of the fourth mask 176, thus forming the positions of the first, second and third contacts 126, 128, 130, then by depositing at least one electrically conductive material in these positions and planarizing the electrically conductive material, thus forming the first, second and third contacts 126, 128, 130. The fourth mask 176 is then removed. The device obtained after this method corresponds to that shown in FIGS. 1 and 2.

In the method described above, the dielectric spacers 132 are produced by depositing a single dielectric material. To produce dielectric spacers 132 as described above with reference to FIG. 6, i.e., such that they include at least a first dielectric material covering the lateral sides of the first portions 112 and at least a second dielectric material, different from the first dielectric material, covering the lateral sides of the second portions 116, the steps described hereinafter with reference to FIG. 27 are for example implemented.

Figure 27:
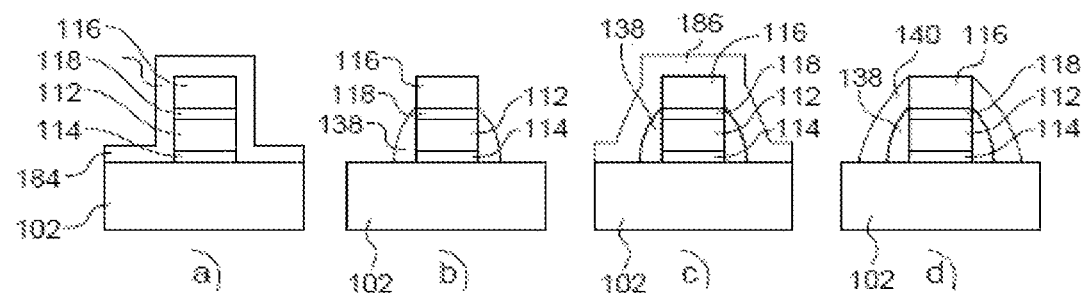
FIG. 27 shows the steps implemented for the production of dielectric spacers including different materials.

As shown in view a) in FIG. 27, a layer 184 including the first dielectric material is deposited in a conforming manner by covering the first and second control gates.

The layer 184 is then etched so that the remaining portions form the first parts 138 which cover the lateral sides of the first portions 112 and the first gate dielectrics 114 (view b) of FIG. 27).

A layer 186 including the second dielectric material is then deposited in a conforming manner (view c) in FIG. 27), then etched so that the remaining portions of this layer form the second parts 140 which cover the lateral sides of the second portions 116 and the second gate dielectrics 118 (view d) of FIG. 27).

In the embodiments and alternative embodiments described above, the device 100 includes several spin qubits coded by an electron stored in a quantum dot. Alternatively, each qubit may be coded by several electrons stored in several neighboring quantum dots, e.g., double or triple quantum dots.

In the different embodiments and alternative embodiments described above, the device 100 corresponds to a spin qubit quantum device. These different embodiments and alternative embodiments may, however, be applied for a device 100 not corresponding to a quantum device and used in a similar operating mode to that of field-effect transistors coupled in series. Such a device 100 may function in a cryogenic environment, i.e., in a cryostat at cryogenic temperatures (less than 1 K, or even less than 4 K). In such an operating mode, the electrostatic control gates of the device 100 are used as conventional transistor gates, the polarizations whereof control the conductance between the regions 121 of the structure.

The invention claimed is:

1. A quantum device, comprising:
a semiconductor portion comprising several first regions configured to form quantum dots of at least one spin qubit of the quantum device, each disposed between at least two second regions forming tunnel barriers and juxtaposed with the two second regions;
first electrostatic control gates, each comprising at least a first portion of electrically conductive material; and
second electrostatic control gates, each second electrostatic control gate being arranged on a first electrostatic control gate, of the first electrostatic control gates, and each second electrostatic control gate comprising at least a second portion of electrically conductive material and at least a second gate dielectric disposed between the second portion of electrically conductive material and the first portion of electrically conductive material of one of the first electrostatic control gates, such that each of the first electrostatic control gates is disposed between the semi-conductor portion and one of the second electrostatic control gates,
wherein the second electrostatic control gates are solely located in a vertical extension of the first electrostatic control gates, said vertical extension being perpendicular to a main plane of the semiconductor portion, and
wherein, in a first configuration, the first and second electrostatic control gates are disposed above the first regions of the semiconductor portion, or wherein, in a second configuration, the first and second electrostatic control gates are disposed above the second regions of the semiconductor portion.

2. The device according to claim 1, wherein:
each of the first electrostatic control gates further includes at least a first gate dielectric disposed between the semiconductor portion and the first portion of electrically conductive material of said first electrostatic control gate,
the device includes a stack of several different semiconductors forming a heterostructure and including the semiconductor portion, such that interfaces between the stack of several semiconductors and the first portions of electrically conductive material of the first electrostatic control gates form Schottky barriers, or
each of the first electrostatic control gates further includes at least a first gate dielectric disposed between a stack of several semiconductors and the first portion of electrically conductive material, the stack of several semiconductors including different semiconductors forming a heterostructure, such that interfaces between the stack of several semiconductors and the at least a first gate dielectric of the first electrostatic control gates form Schottky barriers.

3. The device according to claim 1, wherein the semiconductor of the first and second regions is unintentionally doped.

4. The device according to claim 1, further including electrical charge carrier reservoirs between which the first and second regions of the semiconductor portion are disposed.

5. The device according to claim 1, further including means for applying at least a first electric potential to each of the first portions of electrically conductive material and at least a second electric potential, of a separate value from that of the first electric potential, to each of the second portions of electrically conductive material.

6. The device according to claim 1, wherein the first and second regions of the semiconductor portion are aligned along a first direction, and:
a dimension, parallel with the first direction, of at least one of the first portions of electrically conductive material is less than a dimension, parallel with the first direction, of the second portion of electrically conductive material disposed on said at least one of the first portions of electrically conductive material, or
a dimension, parallel with the first direction, of at least one of the second portions of electrically conductive material is less than a dimension, parallel with the first direction, of the first portion of electrically conductive material disposed under said at least one of the second portions of electrically conductive material.

7. The device according to claim 6, wherein:
each of the first and second portions of electrically conductive material includes a greater dimension extending along a second direction perpendicular to the first direction,
at least one end of each of the first portions of electrically conductive material is not covered by the second portion of electrically conductive material disposed on said first portion of electrically conductive material,
each of the first portions of electrically conductive material is electrically coupled with a first electrically conductive contact produced on said at least one end of each of the first portions of electrically conductive material, and
each of the second portions of electrically conductive material is electrically coupled with a second electrically conductive contact produced on the second portion of electrically conductive material.

8. The device according to claim 7, wherein:
first and second ends of each of the first portions of electrically conductive material are not covered by the second portion of electrically conductive material disposed on said first portion of electrically conductive material, and
each of the first portions of electrically conductive material is electrically coupled with a first electrically conductive contact produced on one of the first and second ends of each of the first portions of electrically conductive material, and two of the first electrically conductive contacts electrically coupled with two of the first portions of electrically conductive material disposed side by side are such that one of said two first electrically conductive contacts is produced on the first end of one of said two of the first portions of electrically conductive material and the other of said two first electrically conductive contacts is produced on the second end of the other of said two of the first portions of electrically conductive material.

9. The device according to claim 1, wherein the semiconductor portion corresponds to a semiconductor nanowire.

10. The device according to claim 9, wherein:
the semiconductor portion includes a top face, a bottom face, and lateral faces substantially perpendicular to the top and bottom faces; and
each of the first and second control gates partially covers at least one of first and second top edges of the semiconductor portion formed at the junctions between the top face and the first and second lateral faces opposite one another and parallel with a greatest dimension of the semiconductor portion.

11. The device according to claim 10, wherein:
several of the first and second control gates partially cover the first top edge and the other first and second control gates partially cover the second top edge, each of the first and second control gates partially covering the first top edge being disposed facing a first and a second control gate partially covering the second top edge; and
the device further includes a third electrostatic control gate comprising at least a third portion of electrically conductive material disposed facing at least a fourth region of the semiconductor portion not covered by the first and second electrostatic control gates.

12. The device according to claim 1, wherein the first regions of the semiconductor portion are arranged in a form of a two-dimensional array, several of the first and second electrostatic control gates being arranged in the form of rows, and the other first and second control gates being arranged in the form of columns.

13. The device according to claim 1, further comprising dielectric spacers covering lateral sides of the first and second electrostatic control gates, and disposed, in the first configuration, above the second regions of the semiconductor portion, or, in the second configuration, above the first regions of the semiconductor portion.

14. The device according to claim 13, wherein the dielectric spacers include at least a first dielectric material covering the lateral sides of the first portions of electrically conductive material and at least a second dielectric material covering the lateral sides of the second portions of electrically conductive material, a permittivity of the first dielectric material being less than that of the second dielectric material.

15. The device according to claim 1, wherein, in a parallel plane with the top faces of the first electrostatic control gates, a cross-section of each second gate dielectric has a similar shape and dimensions to those of a cross-section of at least one of the first and second portions of electrically conductive material disposed against said second gate dielectric.

16. The device according to claim 1, wherein the second gate dielectric rests solely on the first portions of electrically conductive material, or solely on the first portions of electrically conductive material and a part of lateral spacers disposed against the first portions of electrically conductive material.

17. The device according to claim 1, wherein, in said first configuration, the second regions of the semiconductor portion are not covered by the first and second electrostatic control gates, or wherein, in said second configuration, the first and second electrostatic control gates are not covered by the first and second electrostatic control gates.

* * * * *